(12) United States Patent
Nakagawa (10) Patent No.: US 8,013,642 B2
(45) Date of Patent: Sep. 6, 2011

(54) OUTPUT DRIVE CIRCUIT

(75) Inventor: Kurao Nakagawa, Ohtsu (JP)

(73) Assignee: Renesas Electronics Corporation, Kanagawa (JP)

( * ) Notice: Subject to any disclaimer, the term of this patent is extended or adjusted under 35 U.S.C. 154(b) by 134 days.

(21) Appl. No.: 12/478,067

(22) Filed: Jun. 4, 2009

(65) Prior Publication Data

US 2009/0315595 A1 Dec. 24, 2009

(30) Foreign Application Priority Data

Jun. 18, 2008 (JP) .................................. 2008-158690

(51) Int. Cl.
*H03B 1/00* (2006.01)
*H03K 3/00* (2006.01)
(52) U.S. Cl. ........................................................ 327/108
(58) Field of Classification Search .................... 327/108
See application file for complete search history.

(56) References Cited

FOREIGN PATENT DOCUMENTS

| JP | 2005-57573 | | 3/2005 |
|---|---|---|---|
| KR | 1020070113983 | * | 11/2007 |

* cited by examiner

*Primary Examiner* — Lincoln Donovan
*Assistant Examiner* — Daniel Rojas
(74) *Attorney, Agent, or Firm* — Young & Thompson (57) ABSTRACT

An output drive circuit includes: a totem-pole output including: a high-side transistor (HST) with drain and source, an output stage power supply voltage applied to the drain, the source connected to the first node (N1); and a low-side transistor with source and drain, a ground voltage applied to the source, the drain connected to N1; and a bootstrap part including a capacitor supplying charge to a gate of HST when on, the charge being charged when HST is off, and one terminal of the bootstrap part connected to N1, the output drive circuit further including: a first transistor (T1) that conducts when HST is to be on, T1 connected between a drive circuit power supply voltage and the gate of HST; and a second transistor conducting when HST is to be turned on, the second transistor connected between the other terminal of the capacitor and HST gate.

18 Claims, 5 Drawing Sheets

OUTPUT DRIVE CIRCUIT

BACKGROUND

1. Field of the Invention

The present invention relates to an output drive circuit.

2. Description of Related Art

Figure 4:
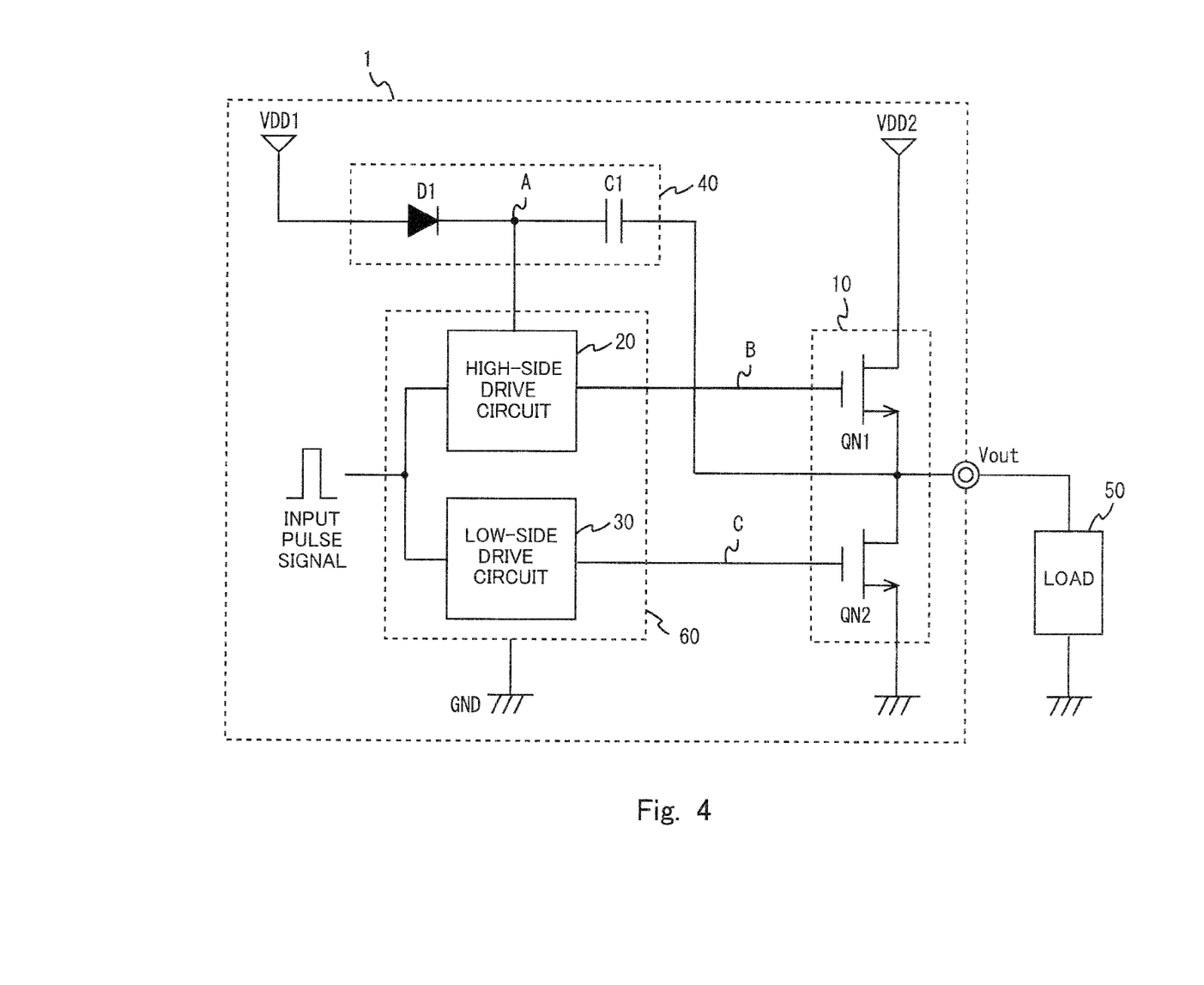
FIG. 4 shows a configuration of an output drive circuit in the prior art.

FIG. 4 shows an output drive circuit 1 of a semiconductor integrated circuit disclosed in Japanese Unexamined Patent Application Publication No. 2005-57573. As shown in FIG. 4, the output drive circuit 1 includes an output part 10, a bootstrap part 40, and a driving part 60. Furthermore, it also includes a drive circuit power supply terminal VDD1, an output stage power supply terminal VDD2, a ground voltage terminal GND, and an output terminal Vout. Note that, for the sake of convenience, the signs "VDD1", "VDD2", "GND", and "Vout" represent the electrical potentials supplied at the respective terminals as well as the names of the terminals.

The output part 10 includes NMOS transistors QN1 and QN2. The output part 10 is a totem-pole-type output circuit using NMOS transistors QN1 and QN2 as high-side and low-side transistors respectively, and drives a load 50 by its totem-pole output.

The drain of the NMOS transistor QN1 is connected to the output stage power supply terminal VDD2, the source is connected to the output terminal Vout, and the gate is connected to a high-side drive circuit 20, which is explained later. The drain of the NMOS transistor QN2 is connected to the output terminal Vout, the source is connected to the ground voltage terminal GND, and the gate is connected to a low-side drive circuit 30, which is explained later. In the following explanation, the gate terminal of the NMOS transistor QN1 is referred to as "node B", and the gate terminal of the NMOS transistor QN2 is referred to as "node C".

The driving part 60 includes a high-side transistor drive circuit 20 and a low-side transistor drive circuit 30. The high-side transistor drive circuit 20 and the low-side transistor drive circuit 30 bring the NMOS transistors QN1 and QN2 to On-states or Off-states in an exclusive manner in response to the input pulse signals input to the respective drive circuits. The high-side transistor drive circuit 20 is connected to the node A. The high-side transistor drive circuit 20 drives the NMOS transistor QN1 with a voltage and a current supplied from this node A. The low-side transistor drive circuit 30 drives the NMOS transistor QN2.

The bootstrap part 40 includes a diode D1 and a capacitor C1. The anode of the diode D1 is connected to the drive circuit power supply terminal VDD1 and the cathode is connected to the node A. One terminal of the capacitor C1 is connected to the node A and the other terminal is connected to the output terminal Vout. When the NMOS transistor QN1 is to be in an On-state, the high-side transistor drive circuit 20 is driven by the bootstrap part 40.

Figure 5:
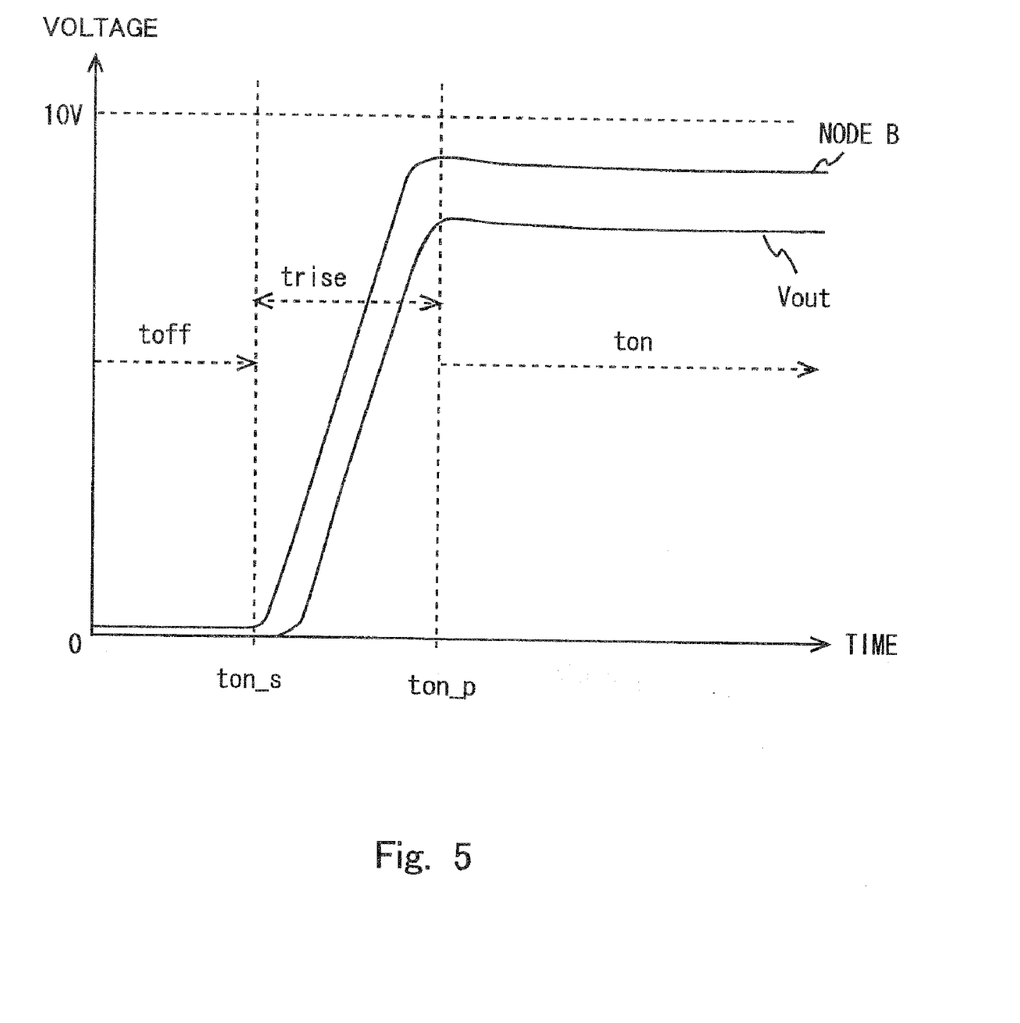
FIG. 5 shows operation waveforms of an output drive circuit in the prior art.

Operations of the output drive circuit 1 are explained hereinafter. FIG. 5 shows a waveform chart for the operations of the output drive circuit 1. The operation waveforms shown in FIG. 5 represent the output voltage Vout and potential at the node B (gate potential of the NMOS transistor QN1). Note that it is assumed that the output stage power supply voltage VDD2 and the drive circuit power supply voltage VDD1 are substantially the same or very close to each other, for examples at around 10 V.

Firstly, in a period from the time 0 to the time ton_s (period toff), both the NMOS transistors QN1 and QN2 are turned off by the high-side transistor drive circuit 20 and the low-side transistor drive circuit 30 respectively. Consequently, the output terminal Vout and the ground voltage terminal GND become a short-circuit state. Therefore, the output voltage Vout is brought to the ground voltage GND. Furthermore, the potential at the node B, which is the gate potential of the NMOS transistor QN1, also falls to the ground voltage GND.

Since the potential of the output terminal Vout is the ground voltage GND, a current flows into the capacitor C1 through the diode D1, so that the capacitor C1 is charged. The charging voltage of the capacitor C1 is a potential difference between the node A and the ground voltage GND. The potential at the node A has a voltage value obtained by subtracting the forward voltage drop Vf of the diode D1 from the drive circuit power supply voltage VDD1.

Next, in a period from the time ton_s to the time ton_p (period trise), the NMOS transistor QN1 is turned on by the high-side transistor drive circuit 20, and the NMOS transistor QN2 is turned off by the low-side transistor drive circuit 30. At this point, the gate potential at the NMOS transistor QN1, i.e., a potential at the node B becomes a potential supplied from the node A through the high-side transistor drive circuit 20. Furthermore, the electrical charge charged in the capacitor C1 passes through the node A and charges the gate capacitance (not shown) of the NMOS transistor QN1 from the output of the high-side transistor drive circuit 20 (node B). As described above, the output drive circuit 1 ensures a driving voltage capable of turning on the NMOS transistor QN1, which serves as the high-side transistor, with the electrical charge charged in the capacitor C1 even when the output stage power supply voltage VDD2 and the drive circuit power supply voltage VDD1 are substantially at the same levels.

Therefore, the NMOS transistor QN1 becomes an On-state, and therefore the output voltage Vout rises. In such a case, however, the output voltage Vout becomes a voltage that is lower than a potential at the note A by an amount equivalent to the gate-on voltage VGS of the NMOS transistor QN1. Therefore, the potential at the output terminal Vout becomes a voltage value obtained by subtracting the forward voltage drop Vf of the diode D1 and the gate-on voltage VGS of the NMOS transistor QN1 from the drive circuit power supply voltage VDD1.

In a period on and after the time ton_p (period ton), the output voltage Vout and the potential at the node B are maintained at the above-described values as long as the NMOS transistor QN1, which serves as the high-side transistor, is in the On-state.

As described above, in the output drive circuit 1, the potential at the node B, which is used to turn on the NMOS transistor QN1, i.e., the gate potential of the NMOS transistor QN1 can hardly rise to the drive circuit power supply voltage VDD1 because of the voltage drop of the diode D1. Therefore, the NMOS transistor QN1 is not sufficiently driven in an On-state operation, thus impairing the starting operation to the On-state. Furthermore, when the On-state operation of the NMOS transistor QN1 is insufficient, the output voltage Vout falls from the output stage power supply voltage VDD2. Accordingly, there has been a problem that the output voltage Vout becomes unstable.

SUMMARY

The present inventors have found a problem that as stated above, a potential at the node B, which is used to turn on the NMOS transistor QN1, i.e., the gate potential of the NMOS transistor QN1 can hardly rise to the drive circuit power supply terminal VDD1 because of the voltage drop of the diode D1 in the output drive circuit 1. Therefore, the NMOS transistor QN1 is not sufficiently driven in an On-state operation, thus impairing the starting operation to the On-state.

Furthermore, when the On-state operation of the NMOS transistor QN1 is insufficient, the output voltage Vout falls from the output stage power supply voltage VDD2. Accordingly, there has been a problem that the output voltage Vout becomes unstable.

A first exemplary aspect of an embodiment of the present invention is an output drive circuit including: a totem-pole-type output part that drives a load connected to a first node, the totem-pole-type output part including: a high-side transistor with a drain and a source, an output stage power supply voltage being applied to the drain, and the source being connected to the first node; and a low-side transistor with a source and a drain, a ground voltage being applied to the source, and the drain being connected to the first node; and a bootstrap part including a capacitive element that supplies electrical charge to a gate of the high-side transistor when the high-side transistor is in an On-state, the electrical charge being charged when the high-side transistor is in an Off-state, and one terminal of the bootstrap part being connected to the first node, the output drive circuit further including: a first switch that becomes a conductive state when the high-side transistor is to be turned on, the first switch being connected between a drive circuit power supply voltage and the gate of the high-side transistor; and a second switch that becomes a conductive state when the high-side transistor is to be turned on, the second switch being connected between the other terminal of the capacitive element and the gate of the high-side transistor.

An output circuit in accordance with an exemplary aspect of the present invention can maintain the gate of the high-side transistor at the power supply voltage when the high-side transistor is in the On-state. Furthermore, the electrical charge that is charged in the capacitive element when the high-side transistor is in the Off-state can be used for an On-state operation of the high-side transistor when the high-side transistor is in the On-state.

The present invention can give stability to the output voltage of an output drive circuit.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
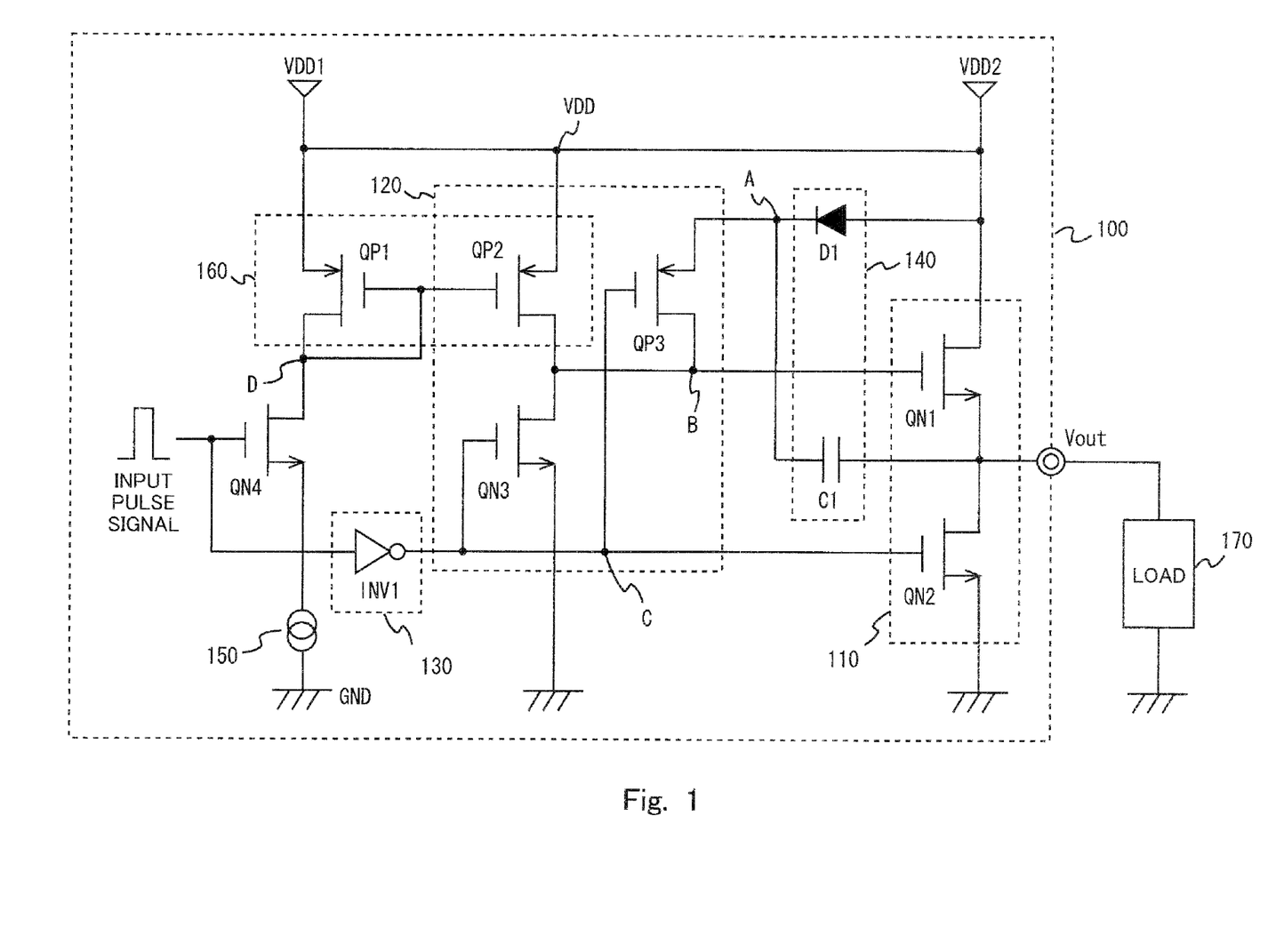
FIG. 1 is an example of a configuration of an output drive circuit in accordance with a first exemplary embodiment of the present invention.

A first exemplary embodiment to which the present invention is applied is explained hereinafter in detail with reference to the drawings. FIG. 1 shows a configuration of an output drive circuit 100 in accordance with a first exemplary embodiment of the present invention. As shown in FIG. 1, the output drive circuit 100 includes an output part 110, a high-side drive circuit 120, a low-side drive circuit 130, a bootstrap circuit 140, a current source 150, a PMOS transistor QP1, and an NMOS transistor QN4. It further includes a drive circuit power supply terminal VDD1, an output stage power supply terminal VDD2, an output terminal Vout, and a ground voltage terminal GND.

It should be noted that in the output drive circuit 100 in accordance with a first exemplary embodiment of the present invention, it is assumed that the drive circuit power supply terminal VDD1 and the output stage power supply terminal VDD2 have the same supply voltages, or supply voltages very close to each there. Therefore, the supply voltages of the drive circuit power supply terminal VDD1 and the output stage power supply terminal VDD2 are referred to as "power supply voltage" in the following explanation. Furthermore, the drive circuit power supply terminal VDD1 and the output stage power supply terminal VDD2 are connected to a common power supply node VDD. Therefore, the voltage supplied from this common power supply node VDD serves as a power supply voltage VDD. This power supply voltage VDD is, for example, around 10 V. Furthermore, it is also assumed that a power supply (not shown, and hereinafter called "output stage power supply VDD2") connected to the output stage power supply terminal VDD2 has a larger power supply capacity than that of a power supply (not shown, and hereinafter called "drive circuit power supply VDD1") connected to the drive circuit power supply terminal VDD1. Note that a ground voltage terminal GND is assumed to supply a ground voltage GND. Furthermore, for the sake of convenience, the sign "Vout" represents the output voltage of the terminal as well as the terminal name.

The output part 110 includes NMOS transistors QN1 and QN2. The output part 110 is a totem-pole-type output circuit using NMOS transistors QN1 and QN2 as high-side and low-side transistors respectively. A load 170 is driven by a totem-pole output from this output part 110.

The drain, source, and gate of the NMOS transistor QN1 are connected to the common power supply node VDD, the output terminal Vout, and the node B respectively. The drain, source, and gate of the NMOS transistor QN2 are connected to the output terminal Vout, the ground voltage terminal GND, and the node C respectively.

The bootstrap circuit 140 includes a diode D1 and a capacitor C1. The anode of the diode D1 is connected to the common power supply node VDD and the cathode is connected to the node A. One terminal of the capacitor C1 is connected to the node A and the other terminal is connected to the output terminal Vout. The capacitance of the capacitor C1 is set to a value according to the gate capacitance of the NMOS transistor QN1, which can be calculated from the element size of the NMOS transistor QN1.

The high-side drive circuit 120 includes PMOS transistors QP2 (first switch) and QP3 (second switch), and an NMOS transistor QN3. The source, drain, and gate of the PMOS transistor QP2 are connected to the common power supply node VDD, the node B, and the node D respectively. The source, drain, and gate of the PMOS transistor QP3 are connected to the node A, the node B, and the node C respectively. The drain, source, and gate of the NMOS transistor QN3 are connected to the node B, the ground voltage terminal GND, and the node C respectively.

The low-side drive circuit 130 includes an inverter INV1. The output terminal of the inverter INV1 is connected to the node C, and an input pulse signal is input to the input terminal.

The source of the PMOS transistor QP1 is connected to the common power supply node VDD, and the drain and the gate are both connected to the node D. Note that the PMOS transistors QP1 and QP2 constitute a current mirror circuit 150 using the PMOS transistor QP1 as a current mirror source.

The drain of an NMOS transistor QN4 is connected to the node D, and the source is connected to one terminal of the current source 150. An input pulse signal is input to the gate of the NMOS transistor QN4.

One terminal of the current source 150 is connected to the source of the NMOS transistor QN4, and the other terminal is connected to the ground voltage terminal GND. The current source 150 feeds a constant current from the one terminal to the other terminal.

Operations of the output drive circuit 100 are explained hereinafter in detail with reference to the drawings. Basically, the output drive circuit 100 performs the same operations as those of the output drive circuit 1 explained above with FIG. 4. That is, in the output drive circuit 100, the high-side drive circuit 120 and the low-side drive circuit 130 perform switching operations such that the NMOS transistor QN1 (high-side transistor) and the NMOS transistor QN2 (low-side transistor) are brought to On-states or Off-states in an exclusive manner.

Figure 2:
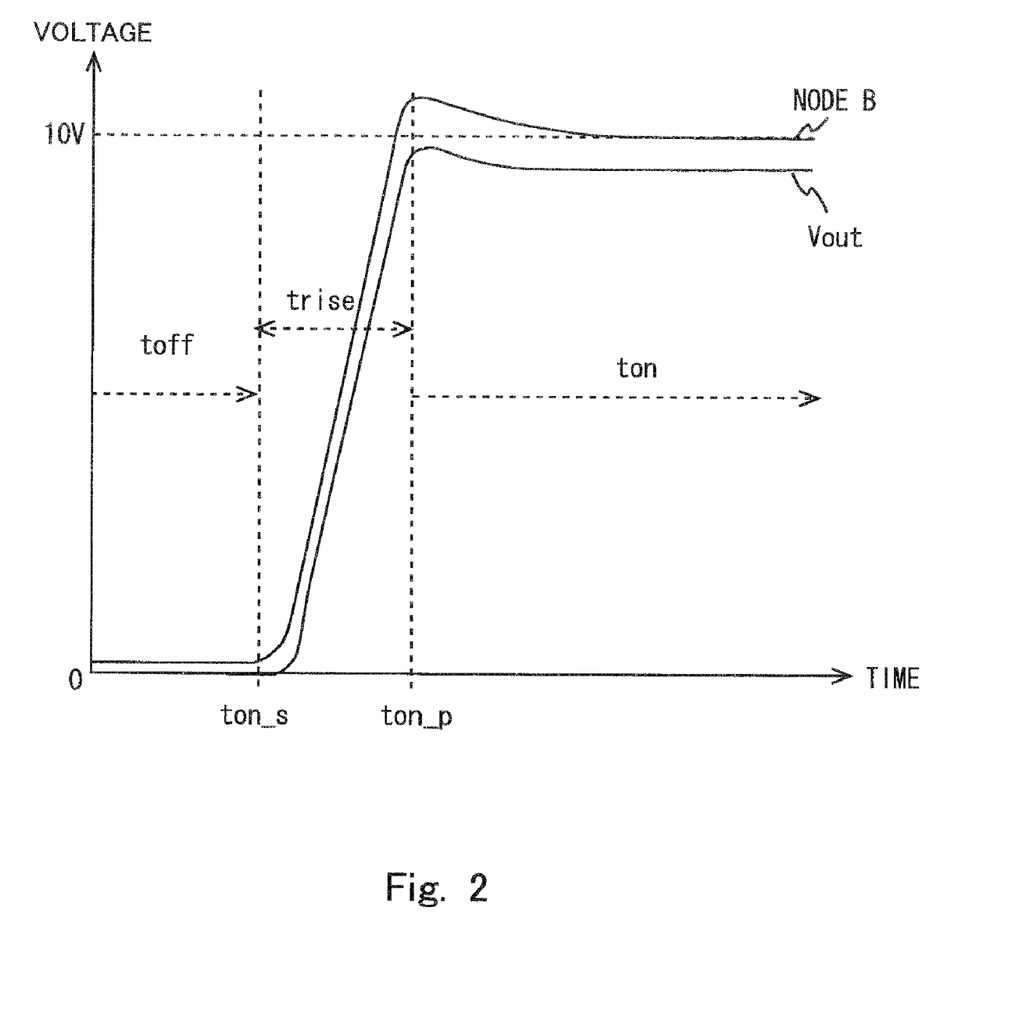
FIG. 2 shows operation waveforms of an output drive circuit in accordance with a first exemplary embodiment of the present invention.

FIG. 2 shows a waveform chart for the operations of the output drive circuit 100. The operation waveforms shown in FIG. 2 represent the output voltage Vout and potential at the node B (gate potential of the NMOS transistor QN1). In this example, the potential at the power supply VDD is assumed to be 10 V.

Firstly, in a period from the time 0 to the time ton_s (period toff), a low-level (e.g., ground voltage GND) of the input pulse signal is input to the gate of the NMOS transistor QN4 and the input terminal of the inverter INV1. At this point, the NMOS transistor QN4 is turned off. Therefore, the PMOS transistor QP1 is also turned off, so that the PMOS transistor QP2, which is the connection destination in the current mirror, is also turned off. Meanwhile, since the output of the inverter INV1 (node C) becomes a high level, the NMOS transistors QN3 and QN2 are both turned on. Furthermore, the PMOS transistor QP3 is turned off.

Since the PMOS transistors QP2 and QP3 are turned off and the NMOS transistor QN3 is turned on in this manner, the potential at the node B falls to the ground voltage GND. Therefore, the NMOS transistor QN1, which serves as the high-side transistor, is turned off. Since the NMOS transistor QN2, which serves as the low-side transistor, is in the On-state, the output terminal Vout is electrically connected to the ground voltage terminal GND. Therefore, if the on-resistance of the NMOS transistor QN2 is very small, the output voltage Vout also falls to the ground voltage GND. Furthermore, since the output voltage Vout is the ground voltage GND, the capacitor C1 is charged with a current flowing through the diode D1. The charging current of this capacitor C1 is mainly supplied from the output stage power supply VDD2 (not shown), which has a larger power supply capacity than that of the drive circuit power supply VDD1 (not shown).

Next, in a period from the time ton_s to the time ton_p (period trise), a high-level (e.g., around 10 V) of the input pulse signal is input to the gate of the NMOS transistor QN4 and the input terminal of the inverter INV1. At this point, the NMOS transistor QN4 is turned on, and the PMOS transistor QP1 is also turned on. Since the PMOS transistor QP1 is turned on, the PMOS transistor QP2, which is the connection destination in the current mirror, is also turned on. Meanwhile, since the output of the inverter INV1 (node C) becomes a low level, the NMOS transistors QN3 and QN2 are turned off. Furthermore, the PMOS transistor QP3 is turned on.

Since the PMOS transistor QP2 is turned on and the NMOS transistor QN3 is turned off in this manner, the drain current of the PMOS transistor QP2 serves so as to charge the gate capacitance (not shown) of the NMOS transistor QN1. This drain current of the PMOS transistor QP2 has the same current value as the constant current value established in the current source 150. Furthermore, since the PMOS transistor QP3 is turned on, electrical charge that was charged in the capacitor C1 during the period toff also flows and serves so as to charge the gate capacitance of the NMOS transistor QN1. Therefore, the output voltage Vout rises.

It should be noted that when the gate capacitance of the NMOS transistor QN1 is being charged, the node B has a voltage value obtained by subtracting a voltage drop determined by the product of the on-resistance of the PMOS transistor QP2 and the drain current of that PMOS transistor QP2 from the power supply voltage VDD. In general, as can be seen from the circuit configuration in FIG. 1, the on-resistance of this PMOS transistor QP2 becomes very small. Furthermore, the drain current of the PMOS transistor QP2 becomes almost zero when the charging of the gate capacitance of the NMOS transistor QN1 has been completed. From these facts, the voltage drop by the on-resistance of the PMOS transistor QP2 is considered to be very small when the charging has been completed. Therefore, a potential at the node B, i.e., the gate potential of the PMOS transistor QP1 is maintained at substantially the same potential as the power supply voltage VDD. Note that since the PMOS transistor QP3 is in the On-state and the potential at the node B is maintained at substantially the same potential as the power supply voltage VDD, the diode D1 becomes an Off-state and does not allow a current to flow therethrough.

Therefore, in the period trise, the output drive circuit 100 charges the gate capacitance of the NMOS transistor QN1 with the above-described two channels, i.e., the drain current of the PMOS transistor QP2 and the current supplied from the capacitor C1 through the PMOS transistor QP3. Consequently, the output drive circuit 100 can speed up a starting operation during which the NMOS transistor QN1 change from an Off-state to an On-state in comparison with the output drive circuit 1. This means that the period trise in FIG. 2 can be shorten in comparison with the period trise of the output drive circuit 1 in the prior art shown in FIG. 5.

Furthermore, as shown in FIG. 2, it is possible to maintain the NMOS transistor QN1 in the On-state with the gate voltage (voltage of the node B) close to the power supply voltage VDD. This voltage is higher than the gate voltage (voltage of the node B) of the output drive circuit 1 in the prior art shown in FIG. 5. Therefore, the output drive circuit 100 can keep the output voltage Vout with stability at a voltage lower than the power supply voltage VDD by a very small amount equivalent to a voltage between the gate and the source (hereinafter called "gate-source voltage") of the NMOS transistor QN1 required to turn on the NMOS transistor QN1. In other words, the output drive circuit 100 can raise the output voltage Vout more swiftly than the output drive circuit 1, and maintain that voltage with stability.

In a period on and after the time ton_p (period ton), the output voltage Vout and the potential at the node B are maintained at the above-described values as long as the NMOS transistor QN1, which serves as the high-side transistor, is in the On-state.

In summary, the output drive circuit 100 in accordance with a first exemplary embodiment of the present invention charges the gate capacitance of the NMOS transistor QN1 with the drain current of the PMOS transistor QP2 and the electrical charge charged in the capacitor C1 during the period trise. Therefore, it is possible to speed up a starting operation for an On-state operation of the NMOS transistor QN1, which serves as the high-side transistor, in comparison with the output drive circuit 1 in the prior art. Furthermore, it is also possible to raise the gate voltage of the NMOS transistor QN1 substantially to the power supply voltage VDD. Then, it is also possible to provide a voltage lower than the power supply voltage VDD by the very small gate-source voltage of the NMOS transistor QN1 required to turn on the NMOS transistor QN1 as the output voltage Vout when the NMOS transistor QN1 is in an On-state. This output voltage Vout is a higher voltage in comparison with the output voltage of the output drive circuit 1 in the prior art.

It should be noted that the output drive circuit 1 in the prior art also has the following problem. The output drive circuit 1 charges the capacitor C1 with the drive circuit power supply voltage VDD1 during the period toff shown in FIG. 5. Then, in the period trise, a discharging current from the capacitor C1 is fed into the gate capacitance of the NMOS transistor QN1. However, if the charging period of the capacitor C1 (period toff) is so short that charged electrical charge is insufficient, the discharging current from the capacitor C1 cannot drive the gate capacitance of the NMOS transistor QN1 when the NMOS transistor QN1 is in an On-state. In such a case, it also causes a problem that the output voltage Vout of the output drive circuit 1 becomes unstable. To avoid this problem, it is conceivable to use a capacitor C1 with a large capacitance. In such a case, it is necessary, however, to increase the power supply capacity of the drive circuit power supply VDD1 of the integrated circuit beforehand, and thus leading to increase in the scale of the circuit. Furthermore, since charging/discharging of the capacitor C1 is performed repeatedly every time a switching operation is performed on output part 10, there has been a drawback that the supply voltage of the drive circuit power supply VDD1 is fluctuated and becomes unstable.

However, the output drive circuit 100 in accordance with a first exemplary embodiment of the present invention has a following advantage for this problem. In the output drive circuit 100, if the capacitance of the capacitor C1 is increased to cope with a situation where the charging time is short, a charging operation for this capacitor C1 is mainly carried out by the output stage power supply VDD2, which has a larger power supply capacity than that of the drive circuit power supply VDD1. Therefore, in contrast to the output drive circuit 1, the drive circuit power supply VDD1 hardly carries out the charging operation. Therefore, the drive circuit power supply voltage VDD1, i.e., a potential at the common power supply node VDD is not affected by the charging/discharging operation for the capacitor C1 and thus stable. Consequently, the driving operation of the NMOS transistor QN1, which serves as the high-side transistor, becomes stable. Furthermore, the output voltage Vout also becomes stable because of this fact.

In summary, the output drive circuit 100 in accordance with a first exemplary embodiment of the present invention can speed up the On-state operation of the NMOS transistor QN1, which serves as the high-side transistor, increase the output voltage Vout, give stability to the power supply voltage VDD (drive circuit power supply voltage) even when the capacitor C1 is large, and give stability to the output voltage Vout in comparison with the output drive circuit 1 in the prior art. Accordingly, it is possible to simultaneously solve reciprocal problems from which the output drive circuit 1 in the prior art has suffered.

Second Exemplary Embodiment

Figure 3:
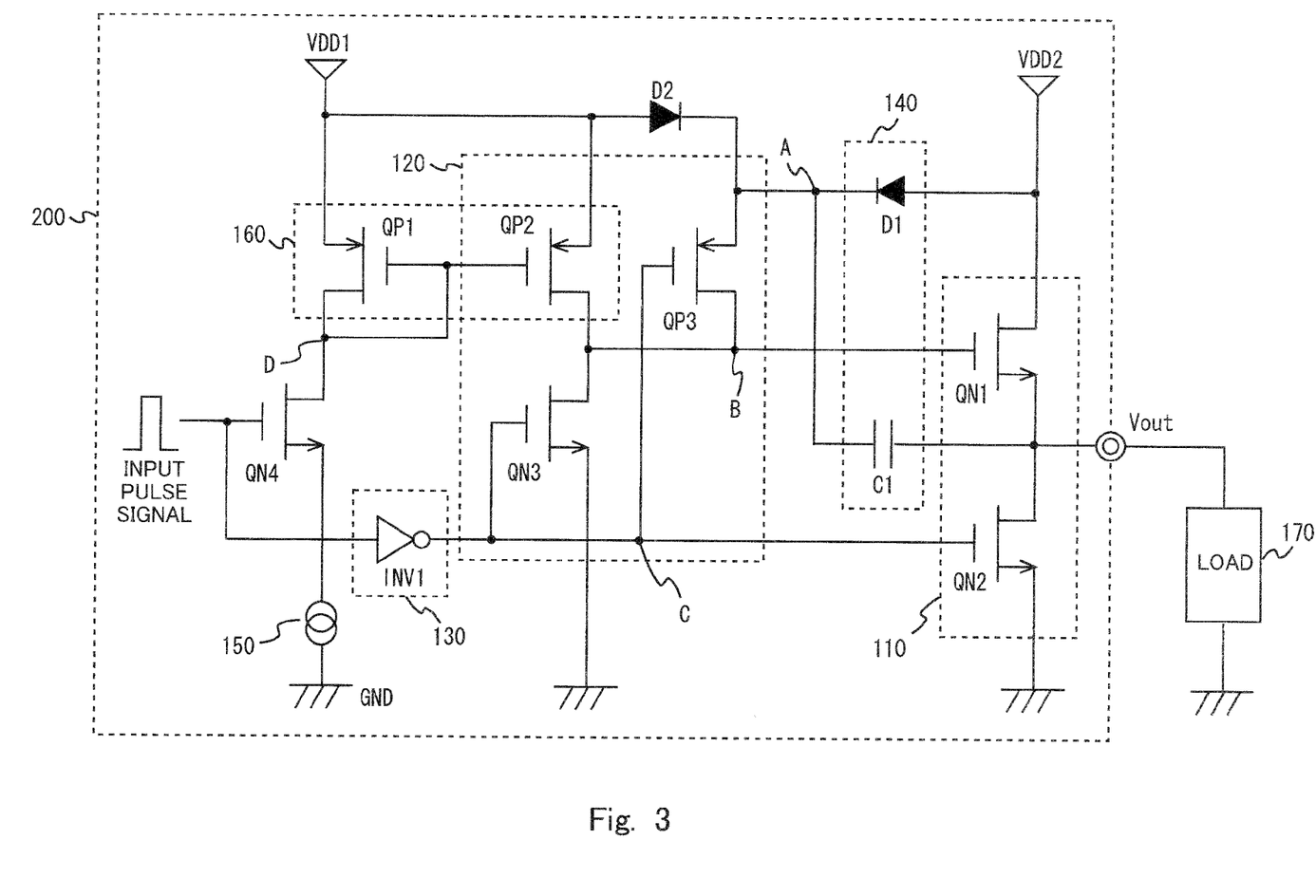
FIG. 3 is an example of a configuration of an output drive circuit in accordance with a second exemplary embodiment of the present invention.

A second exemplary embodiment to which the present invention is applied is explained hereinafter in detail with reference to the drawings. FIG. 3 shows an example of a configuration of an output drive circuit 200 in accordance with a second exemplary embodiment of the present invention. Note that in FIG. 3, elements and structures to which the same signs as those of FIG. 1 are assigned have the same or similar structures to those of FIG. 1. The basic configuration of the output drive circuit 200 is the same as that of the output drive circuit 100 in accordance with a first exemplary embodiment of the present invention. However, in the output drive circuit 200, the output stage power supply terminal VDD2 and the drive circuit power supply terminal VDD1 supply voltages that are different from each other by several volts or greater. Therefore, the circuit configuration is modified to cope with this difference. Since the other structures are the same as those of the output drive circuit 100, only matters related to this difference are explained hereinafter.

As shown in FIG. 3, the output drive circuit 200 includes an additional diode D2 in contrast to the output drive circuit 100. The anode of the diode D2 is connected to the drive circuit power supply terminal VDD1, and the cathode is connected to the node A.

Furthermore, in the output drive circuit 100 in accordance with a first exemplary embodiment of the present invention, the sources of the PMOS transistors QP1 and QP2 and the anode of the diode D1 are all connected to the common power supply node VDD. However, in the output drive circuit 200 in accordance with a second exemplary embodiment of the present invention, the sources of the PMOS transistors QP1 and QP2 are connected only to the drive circuit power supply terminal VDD1. Furthermore, the anode of the diode D1 is connected only to the output stage power supply terminal VDD2. Since the other structures are the same as those of the output drive circuit 100, explanation of them are omitted.

Operations of the output drive circuit 200 having such structures are explained hereinafter. Since the operation waveforms are the same as those shown in FIG. 2, drawing of them are also omitted. Firstly, a case where the output stage power supply voltage VDD2 is sufficiently higher than drive circuit power supply voltage VDD1 is explained. As in the case of the output drive circuit 100, the NMOS transistors QN3 and QN2 are in On-states and the PMOS transistor QP3 is in an Off-state during a period in which the NMOS transistor QN1 is to be in an Off-state. Therefore, the NMOS transistor QN1 is brought to the Off-state, and the output voltage Vout falls to the ground voltage GND. Consequently, the capacitor C1 is mainly charged by a current flowing from the output stage power supply terminal VDD2 through the diode D1. Furthermore, in addition to this current, it is also charged by a current flowing from the drive circuit power supply terminal VDD1 through the diode D2.

During a period in which the NMOS transistor QN1 is in an On-state (period in which the input pulse signal is at a high level), electrical charge charged in this capacitor C1 and the drain current of the PMOS transistor QP2 are both used to charge the gate capacitance of the NMOS transistor QN1 and thus for the On-state operation of the NMOS transistor QN1. Furthermore, the gate voltage of the NMOS transistor QN1 at this point becomes the drive circuit power supply voltage VDD1. Furthermore, this voltage is maintained as long as the NMOS transistor QN1 is in the On-state. Therefore, it is possible to keep the output voltage Vout at a voltage that is lower than the power supply voltage VDD1 by the very small gate-source voltage necessary for the On-state operation of the NMOS transistor QN1. That is, the output drive circuit 200 basically performs similar operations to those of the output drive circuit 100.

Furthermore, even in a case where the drive circuit power supply voltage VDD1 is sufficiently higher than the output stage power supply voltage VDD2, the capacitor C1 is charged with a current flowing from the output stage power supply terminal VDD2 through the diode D1 and a current flowing from the drive circuit power supply terminal VDD1 through the diode D2 during a period in which the NMOS transistor QN1 is an Off-state (period in which the input pulse signal is at a low level). During a period in which the NMOS transistor QN1 is an On-state (period in which the input pulse signal is at a high level), operations are the same as those carried out in the case where the output stage power supply voltage VDD2 is sufficiently higher than the drive circuit power supply voltage VDD1.

As described above, the output drive circuit 200 in accordance with a second exemplary embodiment of the present invention can speed up driving in an On-state operation of the NMOS transistor QN1 as in the case of the output drive circuit 100 even in a case where the output stage power supply terminal VDD2 and the drive circuit power supply terminal VDD1 supply different voltages. In addition, it is possible to raise the gate voltage of the NMOS transistor QN1 substantially to the drive circuit power supply terminal VDD1. As a result, it is also possible to keep the output voltage Vout at a voltage lower than the drive circuit power supply voltage VDD1 by a voltage equivalent to the gate-source voltage of the NMOS transistor QN1 with stability. Therefore, it is possible to establish the drive circuit power supply voltage VDD1 and the output stage power supply voltage VDD2 independently of each other. Furthermore, it is also possible to establish a sufficient capacitance value of the capacitor C1 to drive the NMOS transistor QN1 independently of the portion of the circuit used to drive the high-side drive circuit 120 and the like depending on the voltage situation of the drive circuit power supply voltage VDD1 and the output stage power supply voltage VDD2.

It should be noted that the present invention is not limited to the above-described exemplary embodiments, and those exemplary embodiments may be modified as appropriate without departing from the scope and spirit of the present invention. For example, in the above-described first and second exemplary embodiments of the present invention, a switching element of the PMOS transistor QP2 is used as a voltage and current supply path to the gate capacitance of the NMOS transistor QN1 when the NMOS transistor QN1 in an On-state. However, the charging operation of the gate capacitance of the NMOS transistor QN1 in the On-state may be carried out through two or more channels by using other switching elements in addition to the channel of the switching element of the PMOS transistor QP2.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An output drive circuit comprising:
a totem-pole-type output part that drives a load connected to a first node, the totem-pole-type output part comprising:
a high-side transistor with a drain and a source, an output stage power supply voltage being applied to the drain, and the source being connected to the first node; and
a low-side transistor with a source and a drain, a ground voltage being applied to the source, and the drain being connected to the first node; and
a bootstrap part comprising a capacitive element that supplies electrical charge to a gate of the high-side transistor when the high-side transistor is in an On-state, the electrical charge being charged when the high-side transistor is in an Off-state, and one terminal of the bootstrap part being connected to the first node,
the output drive circuit further comprising:
a first switch that becomes a conductive state when the high-side transistor is to be turned on, the first switch being connected between a drive circuit power supply voltage and the gate of the high-side transistor; and
a second switch that becomes a conductive state when the high-side transistor is to be turned on, the second switch being connected between the other terminal of the capacitive element and the gate of the high-side transistor,
wherein the first switch includes a first transistor and the second switch includes a second transistor, and
wherein the first transistor constitutes a current mirror using a third transistor as an input-side transistor, and feeds a current according to a current flowing the third transistor when in a conductive state.

2. The output drive circuit according to claim 1, wherein a second node between the second switch and the other terminal of the capacitive element is connected to at least one of the output stage power supply voltage and the drive circuit power supply voltage.

3. The output drive circuit according to claim 2, further comprising backward current flow prevention means between the second node and at least one of the output stage power supply voltage and the drive circuit power supply voltage.

4. The output drive circuit according to claim 1, wherein the drive circuit power supply voltage and the gate of the high-side transistor are connected without interposing a diode therebetween.

5. The output drive circuit according to claim 1, wherein the other terminal of the capacitive element is connected to the output stage power supply voltage, and the capacitive element is charged by the output stage power supply voltage when being charged.

6. The output drive circuit according to claim 1, wherein a power supply to supply the output stage power supply voltage has a larger power supply capacity than a power supply capacity of a power supply to supply the drive circuit power supply voltage.

7. The output drive circuit according to claim 1, wherein the output stage power supply voltage and the drive circuit power supply voltage are at substantially the same potentials.

8. An output drive circuit comprising:
a drive circuit power supply voltage node;
an output stage power supply voltage node;
a totem-pole-type output part that drives a load connected to a first node, the totem-pole-type output part comprising i) a high-side transistor with a drain and a source, the drain of the high-side transistor connected to the output stage power supply voltage node, and the source of the high-side transistor connected to the first node; and ii) a low-side transistor with a source and a drain, the source of the low-side transistor connected to a ground voltage node, and the drain of the low-side transistor connected to the first node;

a bootstrap part comprising a capacitive element that supplies electrical charge to a gate of the high-side transistor when the high-side transistor is in an On-state, the electrical charge being charged when the high-side transistor is in an Off-state, one terminal of the capacitive element being connected to the first node;

a first switch that becomes a conductive state when the high-side transistor is to be turned on, the first switch having a source connected to the drive circuit power supply voltage node and having a drain connected to the gate of the high-side transistor; and a second switch that becomes a conductive state when the high-side transistor is to be turned on, the second switch having a source connected the other terminal of the capacitive element and a drain connected to the gate of the high-side transistor.

9. The output drive circuit according to claim 8, wherein a second node between the second switch and the other terminal of the capacitive element connects to at least one of the output stage power supply voltage node and the drive circuit power supply voltage node.

10. The output drive circuit according to claim 9, further comprising a diode connecting the second node and at least one of the output stage power supply voltage node and the drive circuit power supply voltage node.

11. The output drive circuit according to claim 8, wherein the drive circuit power supply voltage node and the gate of the high-side transistor are connected free of any interposing diode therebetween.

12. The output drive circuit according to claim 8, further comprising:
a first diode connecting the second node and the drive circuit power supply voltage node, and
a second diode connecting the second node and the output stage power supply voltage node.

13. The output drive circuit according to claim 8, wherein, the first switch includes a first transistor and the second switch includes a second transistor, and
the first transistor constitutes a current mirror using a third transistor as an input-side transistor, and feeds a current according to a current flowing the third transistor when in a conductive state.

14. The output drive circuit according to claim 8, wherein the other terminal of the capacitive element is connected to the output stage power supply voltage node, and the capacitive element is charged by an output stage power supply voltage when being charged.

15. The output drive circuit according to claim 8, wherein a power supply to supply the output stage power supply voltage node has a larger power supply capacity than a power supply capacity of a power supply to supply the drive circuit power supply voltage node.

16. The output drive circuit according to claim 8, wherein the output stage power supply voltage node and the drive circuit power supply voltage node are connected and are at substantially the same potentials.

17. An output drive circuit comprising:
an output stage power supply voltage node;
an input stage power supply voltage node,
a totem-pole-type output part that drives a load connected to a first node, the totem-pole-type output part comprising i) a high-side transistor with a drain and a source, the drain of the high-side transistor connected to the output stage power supply voltage node, and the source of the high-side transistor connected connected to the first node, and ii) a low-side transistor with a source and a drain, the source of the low-side transistor connected to a ground voltage node, and the drain of the low-side transistor connected to the first node;

a bootstrap part comprising a capacitive element that supplies electrical charge to a gate of the high-side transistor when the high-side transistor is in an On-state, the electrical charge being charged when the high-side transistor is in an Off-state, a first terminal of the capacitive element being connected to the first node, a second terminal of the capacitive element being connected to one of the output stage power supply voltage node and the input stage power supply voltage node;

a first switch that becomes a conductive state when the high-side transistor is to be turned on, the first switch having a first element connected to the drive circuit power supply voltage node and having a second element connected to the gate of the high-side transistor; and a second switch that becomes a conductive state when the high-side transistor is to be turned on, the second switch having a first element connected the second terminal of the capacitive element and a second element connected to the gate of the high-side transistor.

18. The output drive circuit according to claim 17, wherein,
the output stage power supply voltage node and the input stage power supply voltage node are connected by opposing diodes, and
the first element of the second switch that is connected the second terminal of the capacitive element is further connected to the output stage power supply voltage node and the input stage power supply voltage node via the opposing diodes.

* * * * *